United States Patent [19]

Johnson et al.

[11] 4,339,260
[45] Jul. 13, 1982

[54] ENVIRONMENTALLY PROTECTED ELECTRONIC CONTROL FOR A GLASSWARE FORMING MACHINE

[75] Inventors: William E. Johnson; William H. Ryan, both of Toledo, Ohio

[73] Assignee: Owens-Illinois, Inc., Toledo, Ohio

[21] Appl. No.: 224,350

[22] Filed: Jan. 12, 1981

[51] Int. Cl.³ .............................................. C03B 9/40
[52] U.S. Cl. ...................................... 65/160; 65/158; 65/356; 65/DIG. 13; 364/708
[58] Field of Search ................... 65/158, 162, 355, 356, 65/DIG. 13; 364/708

[56] References Cited

U.S. PATENT DOCUMENTS 3,903,404  9/1975  Beall et al. .......................... 364/708
4,071,344  1/1978  Blausey, Jr. .............. 65/DIG. 13 X

*Primary Examiner*—Arthur D. Kellogg
*Attorney, Agent, or Firm*—Gerald T. Welch; Myron E. Click; David H. Wilson

[57] ABSTRACT

A cooling system includes means for maintaining electronic control components of a glassware forming machine at a safe operational temperature. A circuit board heat sink is attached to and substantially covers the component mounting surface of a printed circuit board. The circuit board heat sink includes a thermoconductive pad for each component and a metallic panel. Thermoconductive means engage a portion of the circuit board heat sink to transmit heat energy from the components through the heat sink to a coolant manifold. The thermoconductive means includes at least one card guide for frictionally engaging the circuit board and the circuit board heat sink, and a card rack for supporting the card guide. A coolant manifold has a plurality of passages formed therein for the passage of coolant throughout. The manifold is attached to a housing which encloses and is attached to the card rack and receives the heat energy from the components. The coolant fluid removes the heat energy accumulated by the manifold from the cooling system.

18 Claims, 5 Drawing Figures

ENVIRONMENTALLY PROTECTED ELECTRONIC CONTROL FOR A GLASSWARE FORMING MACHINE

BACKGROUND OF THE INVENTION

1. Field of the Invention

The present invention relates in general to control systems for glassware forming machines and in particular to a cooling system for electronic components located in the hostile industrial environment near a glassware forming machine.

2. Description of the Prior Art

The individual section glassware forming machine is well known and includes a plurality of sections, each having means for forming glassware articles in a timed, predetermined sequence of steps. The forming means in each section are typically operated by pneumatic motors or actuators. The pneumatic motors can be controlled by an electronic control means such as the system disclosed in U.S. Pat. No. 4,152,134.

One problem encountered with the use of electronic control systems in glassware forming machines is that standard commercial-grade integrated circuits cannot be placed in close proximity to the glassware forming machine. The ambient temperature near the glassware forming machine is too high to permit the integrated circuits to function reliably. Furthermore, the air near a glassware forming machine is too hot and polluted to utilize conventional air circulating cooling methods. Electronic control systems of the prior art had to be located away from the area of the machinery in a more suitable environment.

It is desirable to locate the electronic control system near the glassware forming machine. Such positioning reduces interference due to electrical noise and increases the bandwidths of the controlling devices, thereby promoting a more efficient operation. There is, therefore, a need for a cooling system which would permit electronic control components to be located in the hostile industrial environment near a glassware forming machine.

SUMMARY OF THE INVENTION

The present invention concerns a cooling system for maintaining commercial-grade electronic components mounted on a printed circuit board at a safe operational temperature when utilized in a control system located in the hostile industrial environment near a glassware forming machine. The printed circuit board has a circuit board heat sink attached to it which substantially covers the component mounting surface area of the board. The circuit board heat sink includes at least one thermoconductive pad for a component and a metallic panel. The panel has a plurality of holes formed therein to allow electronic components to extend through to the printed circuit board without coming into contact with the circuit board heat sink. A coolant manifold has a plurality of manifold passages formed therein to permit the passage of coolant fluid, supplied from an external source, throughout the manifold. A thermoconductive means engages a portion of the circuit board heat sink and transfers the heat energy from the components to the coolant manifold. In the preferred embodiment, a card guide frictionally engages the circuit board heat sink. A card rack attached to the manifold supports the card guide and transfers the heat energy from the circuit board heat sink to the coolant manifold. The coolant manifold is in contact with an air-tight housing containing both the electronic components and the thermoconductive means.

It is an object of the present invention to provide a cooling system for an electronic control unit of a glassware forming machine.

It is another object of the present invention to provide a cooling apparatus which permits the operation of a microprocessor controller in a severe industrial environment, such as near a glassware forming machine.

It is a further object of the present invention to provide a control system which increases the efficiency and accuracy of individual section glassware forming machines.

Other objects and advantages of the present invention will be apparent to those skilled in the art from the following detailed description of the preferred embodiment when considered in the light of the accompanying drawings.

DETAILED DESCRIPTION OF THE PREFERRED EMBODIMENT

Figure 1:
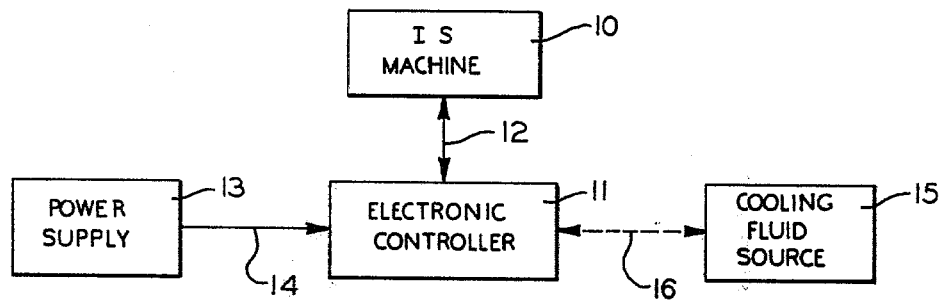
FIG. 1 is a block diagram of an individual section glassware forming machine including an electronic control system according to the present invention.

There is shown in FIG. 1 a block diagram of a glassware forming machine which includes an electronic controller according to the present invention. An individual section glassware forming machine 10 is connected to an electronic controller 11 by one or more lines 12. The controller 11 sends control signals to the machine 10 over the lines 12 and can receive signals from the machine 10 representing the status of the machine. A power supply 13 is connected to the electronic controller 11 by one or more lines 14 to supply electrical power to the components in the controller. The controller 11 is also connected to a cooling fluid source 15 by one or more conduits 16. The cooling fluid source 15 circulates cooling fluid through a cooling system in the electronic controller 11 to maintain the ambient temperature inside the electronic controller at a value which permits the use of commercial-grade electronic components (typically 0° to 70° C. operating range) in the circuits of the electronic controller when the controller is placed in close proximity to the glassware forming machine 10.

Figure 2:
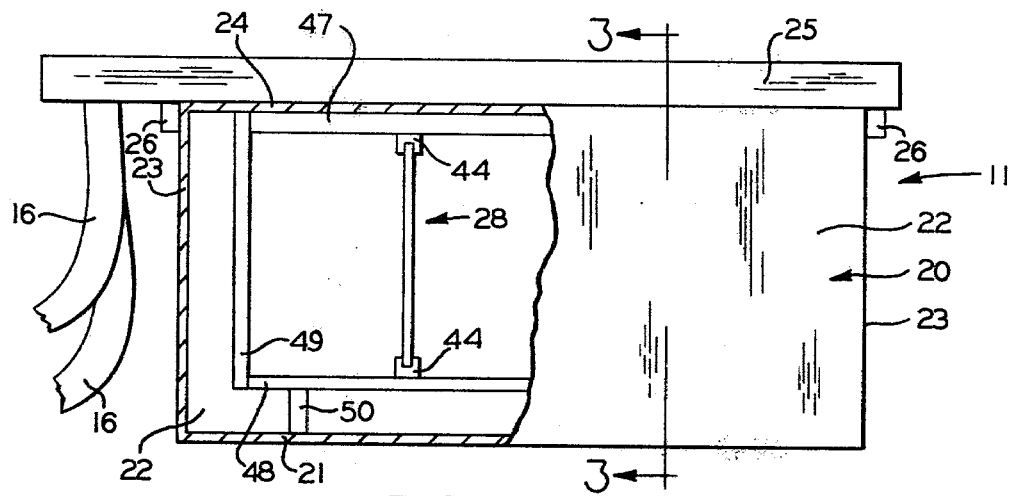
FIG. 2 is a side elevational view of the electronic controller of FIG. 1 with a portion of a side wall broken away.
Figure 3:
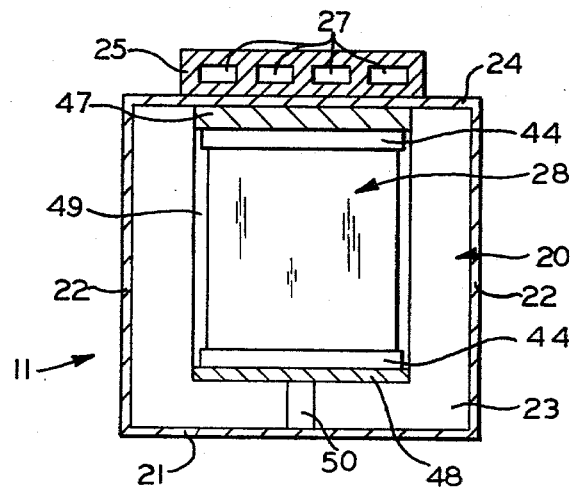
FIG. 3 is a sectional view taken in front elevation along line 3—3 of FIG. 2.

There is shown in FIGS. 2 and 3 the electronic controller 11 of FIG. 1. FIG. 2 is a side elevational view with a portion of the enclosure broken away and FIG. 3 is a sectional view taken in front elevation along the line 3—3 of FIG. 2. The electronic circuits of the electronic controller 11 are enclosed in a sealed housing 20 having a bottom wall 21, side walls 22, end walls 23, and a top wall 24 typically formed from steel. The housing 20 prevents the electronic components of the controller 11 from being exposed to the hot, polluted air typically found near machinery such as a glassware forming machine. The upper surface of the top wall 24 contacts a lower surface of a manifold 25 under pressure. The housing can be secured to the manifold by suitable fasteners or by releasable locks 26 which firmly press the upper surface of the top wall 24 to the lower surface of the manifold 25. One of the side walls 22 can be hinged to provide access to the electronic components.

As shown in FIG. 3, the manifold 25 has a plurality of passages 27 formed therein for the passage of coolant fluid throughout the manifold. A pair of the conduits 16 are connected to the manifold 25 for continuously or cyclically pumping coolant fluid through the passages 27. Two or more of the manifolds 25 can be connected in series or in parallel to the cooling fluid source 15.

Figure 4:
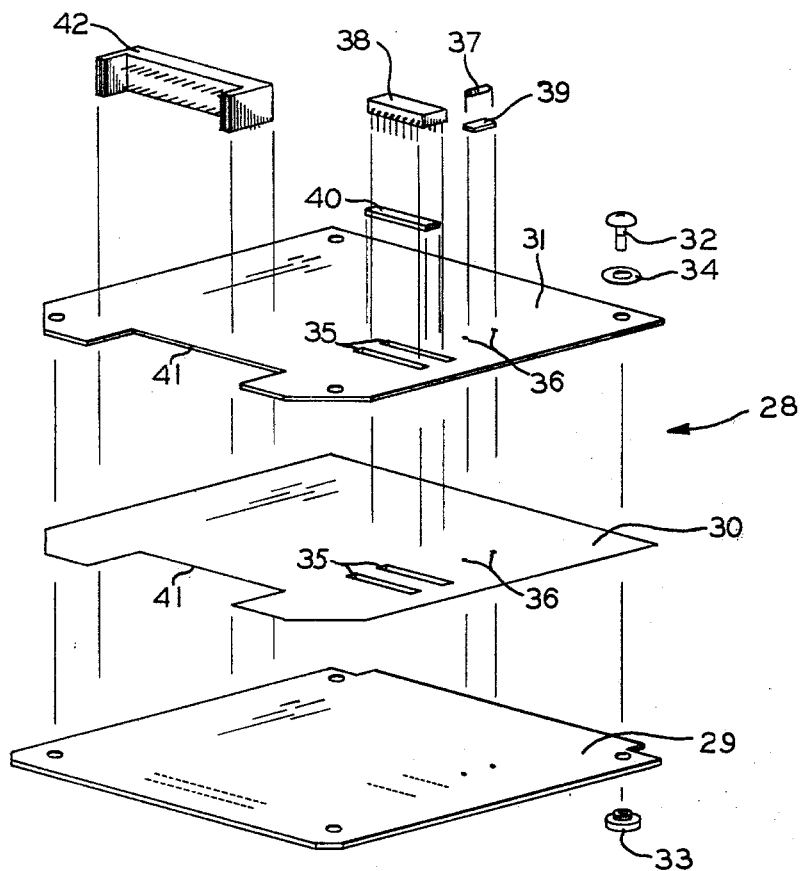
FIG. 4 is an exploded perspective view showing the assembly of the printed circuit board and circuit board heat sink shown in FIG. 2.

Electronic components are typically mounted on a printed circuit board assembly, indicated generally at 28. Such mounting allows rapid interchangeability of components and boards and facilitates efficient maintainence. FIG. 4 illustrates the construction of the printed circuit board assembly 28. A printed circuit board 29 forms the basis of the assembly 28 and is well known in the art. An electrically insulating pad 30 substantially covers the upper surface of the printed circuit board 29. The pad 30 should be flexible enough to conform to the shape of the printed circuit board 29 along the entirety of the surface covered. Typically, the board 29 is double sided and requires an insulator so that the circuit tracks are not shorted out. A pad formed of silicon and manufactured as Sil Pad 400 by Berquist of Minneapolis, Minn. has been found to yield satisfactory results.

A flat metallic panel 31 covers the pad 30. The panel should be a lightweight heat conductor, such as aluminum, for best results. The panel 31, pad 30, and printed circuit board 29 are attached together by a plurality of screws 32 and threaded bushings 33 (only one shown), preferably located at the corners of the circuit board assembly 28. A lockwasher 34 can be utilized under the head of each screw 32.

The pad 30 and the panel 31 have a plurality of apertures 35 and 36 formed therein to permit portions of the electronic components to extend through to the printed circuit board 29. As illustrated in FIG. 3, a resistor 37, and an integrated circuit chip 38 each extend through to the printed circuit board 29. Thermoconductive pads 39 and 40 can be used to space the electrical components above the metallic panel 31. The pad 30 and the panel 31 are each notched out at 41 to accept a cable connector 42 which is mounted on the board 29.

Although the pad 30 has been shown as a separate element which contacts the surface of the printed circuit board 29, it can be formed integral with the board from one or more sheets of solder mask. A sheet of semi-aqueous dry film photopolymer resist, which is available from the Dynachem Corporation of Santa Ana, Calif., can be utilized. The sheet can be applied during the fabrication of the board 29 and exposed with the same mask which is utilized on the other side of the board to open the apertures for the component leads.

The thermoconductive pads 39 and 40 are formed from a resilient material thereby ensuring good contact with the electrical components and the plate 31. A satisfactory pad material is available from Chomerics of Woburn, Mass. as Cho-Therm 1671 material.

Figure 5:
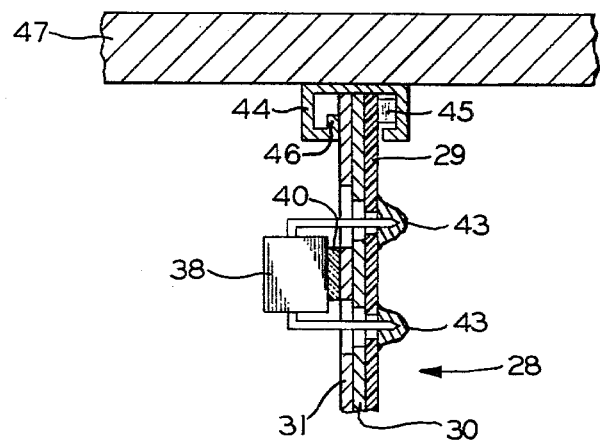
FIG. 5 is an enlarged fragmentary view of the printed circuit board and heat sink shown in FIG. 2.

FIG. 5 is an enlarged fragmentary view of a portion of the printed circuit board assembly 28. The integrated circuit chip 38 rests on the thermoconductive pad 40 and has leads which extend through the printed circuit board 29, where solder connections 43 make electrical and mechanical joints in conventional fashion. Heat energy generated by the operation of the electrical components, such as the integrated circuit chip 38, as a result of the Joule effect, is conducted through the thermoconductive pad 40 to the metallic panel 31.

Thermal energy collected by the panel 31 is transmitted to the coolant manifold 25 by a thermoconductive means which engages a portion of the circuit board heat sink. In the illustrated embodiment, a pair of card guides 44 frictionally engage the circuit board assembly 28. Each card guide 44 has a spring 45 which pushes against the board 29 forcing the plate 31 into contact with a flange 46 of the card guide. The card guides are supported by an upper card rack 47 and a lower card rack 48. Although two card guides 44 are illustrated, it will be appreciated that the use of any number of such guides is contemplated within the scope of the invention. The card racks 47 and 48 are attached at ends thereof to a pair (only one shown) of end plates 49 to form a card cage structure open at the sides for air circulation and ease of replacement of the board assemblies 28. The card cage has the upper surface of the upper card rack pressed against the lower surface of the top wall 25 for increased thermal conduction by one or more spring loaded supports 50. The card guides 44 and card racks 47 and 48 hold the circuit board assembly 27 in proper position within the housing 20. The upper card rack 47 is approximately twice as thick as the lower card rack 48 since the upper card rack also functions as a thermoconductive path.

The heat energy which accumulates in the metallic panel 31 will seek a path to an area having a lower heat energy level. Thus, the accumulated heat will pass from the metallic panel 31 through the card guide 44 and into the large upper card rack 47. The coolant manifold 25 is in contact with the top wall 24 which, in turn, is in contact with the upper card rack 44 and absorbs much of the transmitted thermal energy. The coolant fluid which continuously circulates throughout the manifold passages 27 removes most of the heat acquired by the manifold 25. Thus, the electronic components mounted on the printed circuit board 29 are maintained at a safe operational temperature.

As stated above, the present invention permits an electronic controller to be placed in close proximity to a glassware forming machine. Such an environment can have ambient temperatures of approximately 125° F., close proximity radiation source temperatures of approximately 170° F., and point source temperatures of 2000° F. The present invention permits the use of commercial-grade (operating temperature range of 0° to 70° C.) integrated circuits in an enclosure required to be sealed to allow steam cleaning and with space limitations that dictate circuit densities too great for radiation or forced convection cooling. The present invention achieves cooling through conduction to a circulating fluid coolant.

In accordance with the provisions of the patent statutes, the principle and mode of operation of the invention have been explained and illustrated in its preferred embodiment. However, it must be understood that the invention can be practiced otherwise than as specifically illustrated and described without departing from its spirit or scope.

What is claimed is:

1. In a glassware forming machine having an electronic control system including an electronic component and means for mounting the electronic component, a cooling system comprising:
heat sink means in heat transfer relationship between the electronic component and the mounting means;
a cooling manifold means; and
thermoconductive means in heat transfer relationship between said heat sink means and said manifold means whereby heat generated in the electronic component is transferred to said manifold means by said heat sink means and said thermoconductive means to cool the electronic component.

2. The cooling system according to claim 1 wherein said heat sink means includes a thermoconductive pad having a first surface abutting a surface of the electronic component.

3. The cooling system according to claim 2 wherein said heat sink means includes a metallic panel having a surface abutting a second surface of said thermoconductive pad.

4. The cooling system according to claim 1 wherein said heat sink means includes a metallic panel in heat transfer relationship between the electronic component and the means for mounting the electronic component.

5. The cooling system according to claim 4 including a thermoconductive pad positioned between said metallic panel and the electronic component.

6. The cooling system according to claim 1 wherein said manifold means includes a plurality of fluid passages formed therein and means for connecting said passages to a source of coolant fluid.

7. The cooling system according to claim 1 wherein said thermoconductive means includes a card guide for retaining the mounting means and said heat sink means in heat transfer relation therewith, and a card rack for supporting said card guide in heat transfer relationship with said manifold means.

8. A cooling system for a glassware forming machine electronic control, the electronic control having at least one circuit board with a plurality of electronic components mounted thereon, comprising:
heat sink means in heat transfer relationship with the electronic components;
a housing enclosing the electronic control;
a manifold means attached to said housing for transferring heat energy away from the electronic control; and
thermoconductive means in heat transfer relationship between said heat sink means and said manifold means.

9. The cooling system according to claim 8 wherein said heat sink means includes at least one thermoconductive pad having a surface abutting one of the electronic components.

10. The cooling system according to claim 8 wherein said heat sink means includes a metallic panel having a surface in heat transfer relationship with each of the electronic components.

11. The cooling system according to claim 8 wherein said heat sink means includes a plurality of thermoconductive pads each positioned between one of the electronic components and said heat sink means.

12. The cooling system according to claim 8 wherein said manifold means includes a plurality of fluid passages formed therein and means for connecting said fluid passages to a source of coolant fluid.

13. The cooling system according to claim 8 wherein said thermoconductive means includes a card guide means for retaining said heat sink means and the circuit board and in heat transfer relationship with said manifold means.

14. The cooling system according to claim 8 wherein said thermoconductive means includes a card rack means in heat transfer relationship between said heat sink means and said manifold means.

15. A cooling system for a glassware forming machine electronic control having at least one circuit board with a plurality of electronic components mounted thereon, comprising:
heat sink means including thermoconductive pads and a metallic panel positioned between the circuit board and the electronic components, each of said thermoconductive pads having a surface abutting an electronic component and said metallic panel having a surface in heat transfer relationship with the thermoconductive pads;
a housing enclosing the circuit board and said heat sink means and including a manifold means and means for connecting said manifold means to a source of coolant fluid; and
thermoconductive means in heat transfer relationship between said heat sink means and said manifold means.

16. The cooling system according to claim 15 including an electrically insulating pad positioned between said metallic panel and the circuit board.

17. The cooling system according to claim 15 wherein said metallic panel is formed of aluminum.

18. The cooling system according to claim 15 wherein said thermoconductive means includes a card guide for retaining the circuit board and said metallic panel; and a card rack connected between said card guide and said housing.

* * * * *